United States Patent
Wada et al.

(10) Patent No.: US 7,535,038 B2
(45) Date of Patent: May 19, 2009

(54) SOLID-STATE IMAGING DEVICE AND ITS MANUFACTURING METHOD

(75) Inventors: Kazushi Wada, Kanagawa (JP); Kouichi Harada, Kanagawa (JP); Shuji Otsuka, Kanagawa (JP); Mitsuru Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 43 days.

(21) Appl. No.: 10/521,587

(22) PCT Filed: Aug. 11, 2003

(86) PCT No.: PCT/JP03/10217

§ 371 (c)(1),
(2), (4) Date: Feb. 10, 2005

(87) PCT Pub. No.: WO2004/017411

PCT Pub. Date: Feb. 26, 2004

(65) Prior Publication Data

US 2006/0163617 A1    Jul. 27, 2006

(30) Foreign Application Priority Data

Aug. 12, 2002  (JP)  ............................. 2002-235125
Nov. 8, 2002   (JP)  ............................. 2002-324613

(51) Int. Cl.
    *H01L 29/74*    (2006.01)
(52) U.S. Cl. ..................... 257/219; 257/215; 257/216; 257/218; 257/234
(58) Field of Classification Search ......... 257/215–216, 257/218–219, 226, 234, 444, 222, 314, 322, 257/E21.135
    See application file for complete search history.

(56) References Cited

U.S. PATENT DOCUMENTS

| 4,688,098 | A | * | 8/1987 | Kon et al. .................... 348/299 |
| 5,656,928 | A | * | 8/1997 | Suzuki et al. .............. 324/71.1 |
| 6,573,937 | B1 | * | 6/2003 | Nakashiba ................... 348/314 |
| 6,642,541 | B2 | * | 11/2003 | Nagata et al. ................. 257/59 |
| 6,690,423 | B1 | * | 2/2004 | Nakamura et al. .......... 348/311 |
| 6,765,246 | B2 | * | 7/2004 | Inagaki ....................... 257/223 |
| 7,102,680 | B2 | * | 9/2006 | Mori et al. .................. 348/314 |
| 2003/0059974 | A1 | * | 3/2003 | Harada ......................... 438/57 |
| 2003/0085399 | A1 | * | 5/2003 | Inagaki ......................... 257/53 |

FOREIGN PATENT DOCUMENTS

| JP | 2000-299456 | 10/2000 |
| JP | 2001-257338 | 9/2001 |
| JP | 2002-198507 | 7/2002 |

* cited by examiner

*Primary Examiner*—Phuc T Dang
*Assistant Examiner*—Thanh Y Tran
(74) *Attorney, Agent, or Firm*—Frommer Lawrence & Haug LLP; William S. Frommer; Thomas F. Presson

(57) ABSTRACT

A solid-state image pickup device for preventing crosstalk between adjacent pixels by providing an overflow barrier at the deep potion of a substrate. A partial P type region is provided at the predetermined position of a lower layer region of the vertical transfer register and a channel stop region. This P type region adjusts potential in the lower layer region of the vertical transfer register and the channel stop region. Accordingly, since the potential in the lower layer region of the vertical transfer register and the channel stop region at both sides of the lower layer region is low, electric charges photoelectrically-converted by the sensor region are blocked by this potential barrier and cannot be diffused easily.

6 Claims, 10 Drawing Sheets

SOLID-STATE IMAGING DEVICE AND ITS MANUFACTURING METHOD

TECHNICAL FIELD

The present invention relates to a solid-state image pickup device having a semiconductor substrate on which there are provided a plurality of pixels composed of photoelectric conversion portions and CCD transfer portions for transferring signal electric charges generated by these pixels, and particularly to a solid-state image pickup device having a vertical overflow barrier structure for discharging extra electric charges generated in the photoelectric conversion portions to the back direction of the semiconductor substrate.

BACKGROUND ART

As a solid-state image pickup device of this kind, there has hitherto been known a CCD image sensor having pixels arranged in a matrix fashion.

FIG. 10 is a plan view generally showing an example of an arrangement of a conventional CCD image sensor.

This CCD image sensor includes a semiconductor substrate (Si substrate, semiconductor chip) 10 on which there is provided an image pickup region 20. In this image pickup region, there are disposed photosensors (photodiodes) 22 as photoelectric conversion portions, each of which serves as a pixel, a plurality of vertical transfer registers 24 and channel stop regions 26 at every photosensor column. Further, a horizontal transfer register 32 and an output portion 34 are provided at the outside of the image pickup region 20.

The outside of the image pickup region 20 is used as a peripheral region 21 in which bus lines and the like are placed.

Signal electric charges generated by each photosensor 22 are read to the vertical transfer register 24, transferred to the vertical direction at every photosensor column and thereby outputted to the horizontal transfer register 32 in turn.

The horizontal transfer register 32 transfers signal electric charges, transferred from the respective photosensors 22 by the vertical transfer register 24, to the horizontal direction at every row and outputs the transferred signal electric charges to the output portion 34 in turn.

The output portion 34 converts the signal electric charges, transferred by the horizontal transfer register 32, into voltage signals in turn and outputs the voltage signals after it has processed the voltage signals in such a suitable way as to amplify them.

The channel stop region 26 is adapted to block leakage of signals between the adjacent photosensor columns.

FIG. 11 is a cross-sectional view showing structures of elements within the CCD image sensor shown in FIG. 10 and shows the cross-section taken along the line a-a in FIG. 10.

As illustrated, on the upper layer of the semiconductor substrate (Si substrate) 10, there are formed the photosensor 22, the vertical transfer register 24 and the channel stop region 26. A transfer electrode (polysilicon film) 44 of the vertical transfer register 24 is deposited on the upper surface of the semiconductor substrate 10 through an insulating film (silicon oxide film) 42, and a light-shielding film 46 is attached to the upper layer of this transfer electrode.

This light-shielding film 46 has an opening portion 46A formed at its portion corresponding to the light-receiving region of the photosensor 22, and light can be introduced into the photosensor 22 through this opening portion 46A.

Also, the photosensor 22 includes a $P^+$ layer 22A of an upper layer and an N layer of a lower layer. Holes generated by photoelectric conversion are supplied to the $P^+$ layer 22 and signal electric charges are generated from the N layer 22B.

The signal electric charges generated by the N layer 22B are accumulated in a depletion layer formed on the lower layer of the N layer 22B and they are read from the photosensor 22 to the side of the vertical transfer register 24 as a read gate portion provided between the photosensor 22 and the vertical transfer register 24 is operated.

Further, in the inside region of the semiconductor substrate 10, there is provided an overflow barrier (OFB) by which signal electric charges generated by each photosensor 22 are stored in the lower portion region of the N layer 22B.

This overflow barrier 28 forms a potential barrier in the inside region of the semiconductor substrate 10 by adjusting a distribution of impurities within the semiconductor substrate to block leakage of signal electric charges. Also, when light of an excess light amount becomes incident on this solid-state image pickup device, signal electric charges excessively generated by the photosensor 22 are discharged to the rear side of the semiconductor substrate 10 through this overflow barrier 28.

In the above-mentioned CCD solid-state image pickup device, as the unit pixel is miniaturized increasingly, development of technology for increasing sensitivity per unit area becomes the most urgent need.

As one of the means of such technology, it is considered that the overflow barrier is not formed at the position with a depth of approximately 3 μm from the surface of the Si substrate like the prior art but the overflow barrier should be formed at the deeper position (for example, at the position with a depth of 5 μm to 10 μm from the surface of the substrate).

In this state, when potential of the conventional vertical transfer register is formed, its potential distributions are obtained as shown in FIGS. 12 and 13.

More specifically, FIG. 12 is an explanatory diagram showing potential distributions of the photosensor and the vertical transfer register along the cross-section of the substrate in which the vertical axis represents the depth of potential and the horizontal axis represents the depth from the surface of the substrate. Then, a solid line characteristic curve A shows a potential distribution of the photosensor portion and a broken line characteristic curve B shows a potential distribution of the vertical transfer register portion.

Also, FIG. 13 is an explanatory diagrams showing the potential distribution in the photosensor region in a three-dimensional fashion in which the X axis represents the horizontal direction, the Y axis represents the depth direction of potential and the Z axis represents the depth direction of the substrate, respectively. A plane formed by the X axis and the Y axis represents the surface of the substrate.

The vertical axis in FIG. 12 and the Y axis of FIG. 13 mean the fact that potential becomes higher in the lower direction. Also, numerical values on graduation on each axis are those adjusted for convenience.

In such potential distributions, the potential position of the photosensor and the potential position of the lower layer portion of the vertical transfer register become equal to each other in the deep portion of the substrate.

Accordingly, in such state, electric charges photoelectrically-converted by the sensor region are diffused in the lateral direction (shown by an arrow D in FIG. 13). As a result, a problem called crosstalk arises, in which electric charges are caused to enter the sensor region of the adjacent pixel.

It is an object of the present invention to provide a solid-state image pickup device in which crosstalk between the adjacent pixels can be prevented effectively even when an overflow barrier is provided at the deep portion of a substrate.

DISCLOSURE OF THE INVENTION

In order to attain the above-described object, according to the present invention, there is provided a solid-state image pickup device comprising a plurality of pixels provided on a semiconductor substrate and which contain photoelectric conversion portions to generate electric charges in response to a light amount of incident light, transfer portions formed on the semiconductor substrate to transfer the electric charges read out from the pixels and an overflow barrier formed of a potential barrier to discharge extra electric charges generated in the pixels to the rear direction of the semiconductor substrate and in which potential in the lower layer region of the transfer portion is formed smaller than that of the lower layer region of the photoelectric conversion portion in a range from the minimum potential position of the transfer portion to the overflow barrier.

BEST MODE FOR CARRYING OUT THE INVENTION

Solid-state image pickup devices according to embodiments of the present invention will be described below.

Figure 1:
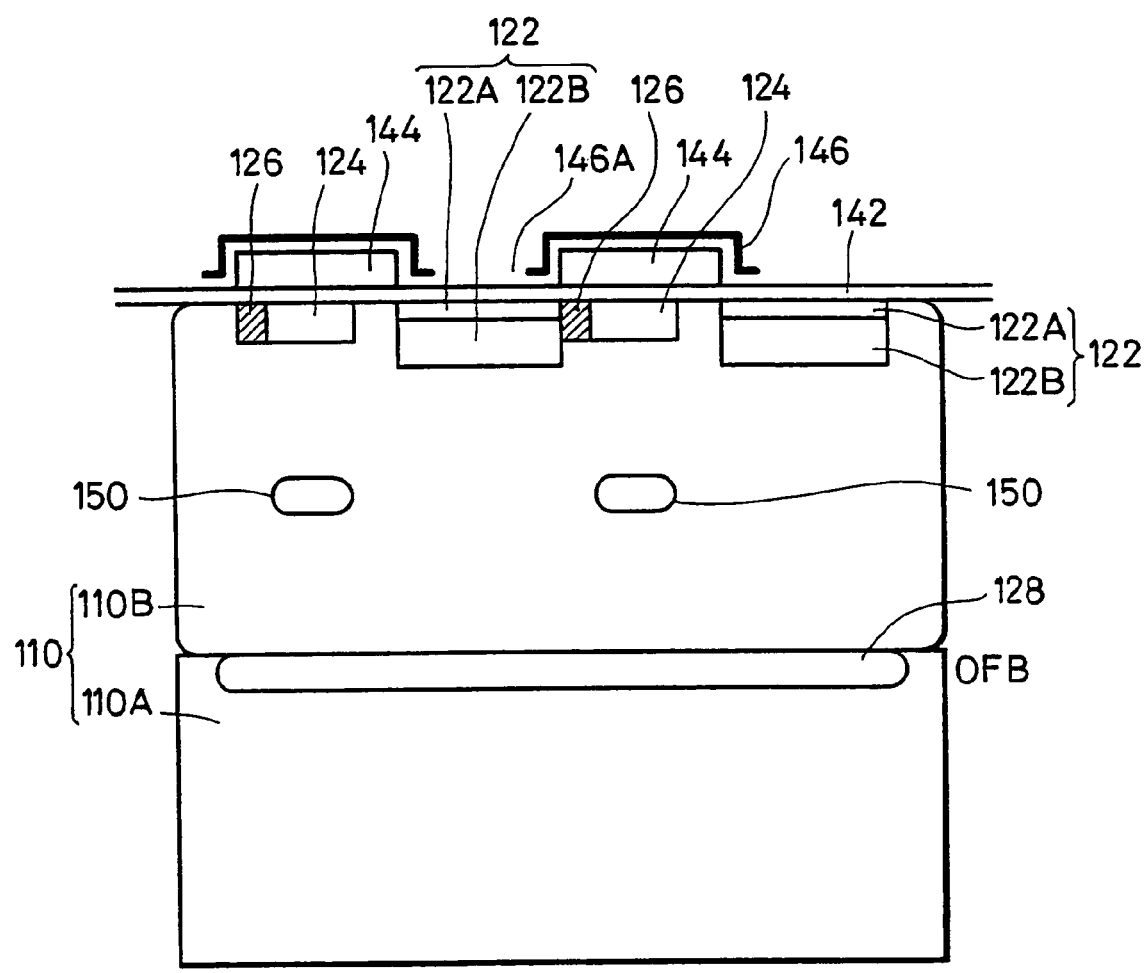
FIG. 1 is a cross-sectional view showing structures of elements of a CCD image sensor according to a first embodiment of the present invention.
Figure 10:
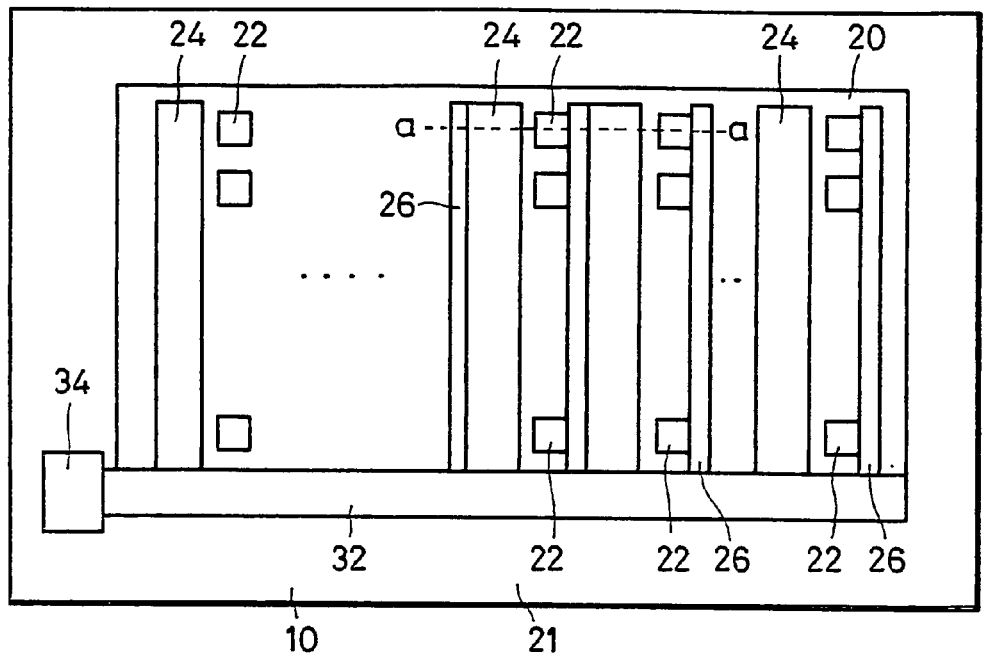
FIG. 10 is a plan view showing the layout of elements in a conventional CCD image sensor.

FIG. 1 is a cross-sectional view showing structures of elements within a CCD image sensor according to a first embodiment of the present invention. The manner in which the elements are arranged in the plane direction of the CCD image sensor according to this embodiment is common to that of the conventional example shown in FIG. 10 and FIG. 1 shows the cross-section taken along the line a-a in FIG. 10.

Figure 11:
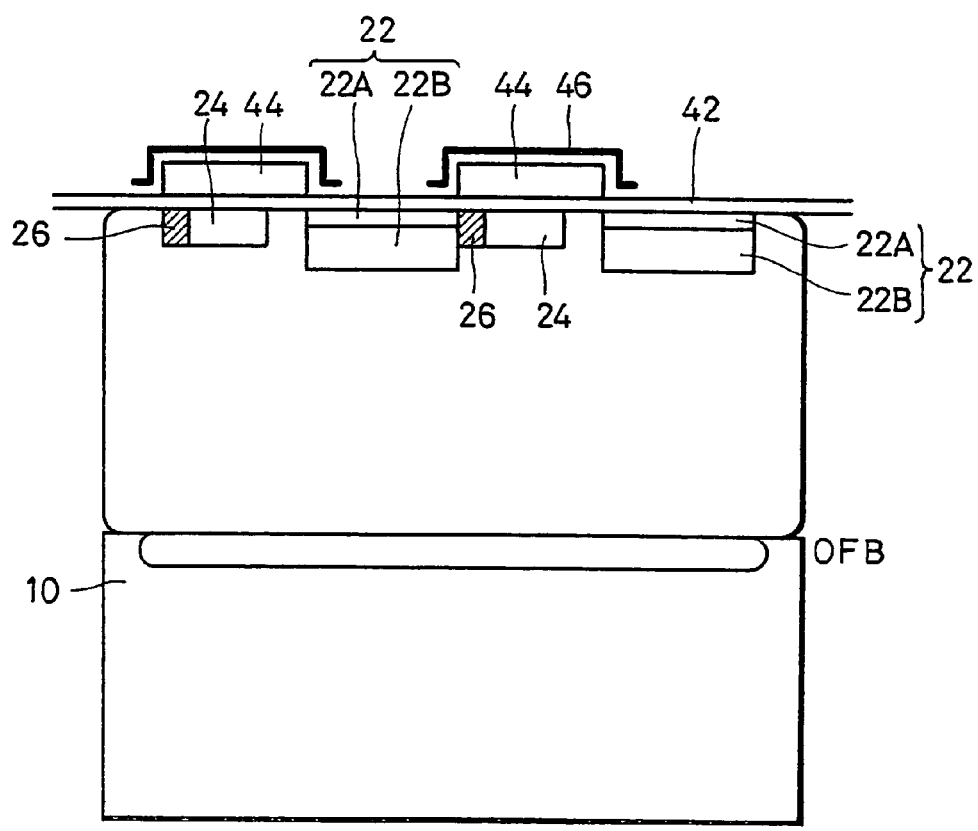
FIG. 11 is a cross-sectional view showing structures of elements of the CCD image sensor shown in FIG. 10.

As shown in FIG. 1, in the image sensor according to this embodiment, similarly to the image sensor shown in FIG. 11, a photosensor 122, a vertical transfer register 124 and a channel stop region 126 are formed on the upper layer of a semiconductor substrate (Si substrate) 110. A transfer electrode (polysilicon film) 144 of the vertical transfer register 124 is disposed on the upper surface of the semiconductor substrate 110 through an insulating film (silicon oxide film) 142 and a light-shielding film 146 is attached to the upper layer of the transfer electrode.

This light-shielding film 146 has an opening portion 146A at its position corresponding to the light-receiving region of the photosensor 122. Light can be introduced into the photosensor 122 through this opening portion 146A.

The photosensor 122 includes a $P^+$ layer 122A of an upper layer and an N layer 122B of a lower layer. Holes generated by photoelectric-conversion are supplied to the $P^+$ layer 122A and signal electric charges are generated from the N layer 122B.

Signal electric charges generated from this N layer 122B are accumulated in a depletion layer formed on the under layer of the N layer 122B and they are read from the photosensor 122 to the side of the vertical transfer register 124 as a read gate portion formed between the photosensor 122 and the vertical transfer register 124 is operated.

While the N layer 122B of the single layer is provided under the $P^+$ layer 122A according to this embodiment, when the overflow barrier and the depletion layer are formed at the deep positions of the substrate 110, an $N^-$ layer with a low concentration can be formed on the lower layer of the N layer 122B.

Also, the semiconductor substrate 110 includes in its inside region formed an overflow barrier (OFB) 128 to store signal electric charges, generated from each photosensor 122, in the lower portion region of the N layer 122B.

This overflow barrier 128 forms potential barriers in the inside region of the semiconductor substrate 110 to stop leakage of signal electric charges by adjusting a distribution of impurities within the semiconductor substrate. Also, when light of excessive light amount is introduced into this solid-state image pickup device, signal electric charges excessively generated by the photosensor 122 are discharged to the rear side of the semiconductor substrate 110 through this overflow barrier 128.

Further, in the semiconductor substrate 110, a high resistance layer 110B may be provided on the upper layer of the N type substrate 110A by a predetermined method (for example, epitaxial growth) and various elements may be formed on this high resistance layer 110B. In that case, the overflow barrier 128 may be formed near the boundary between the N type substrate 110A and the high resistance layer 110B.

This overflow barrier 128 is formed at the position with a depth of 5 μm to 10 μm from the surface of the substrate 110.

Then, in this embodiment, a partial P type region 150 is formed at the predetermined position of the lower layer region of the vertical transfer register 124 and the channel stop region 126. Potential in the lower layer region of the vertical transfer register 124 and the channel stop region 126 is adjusted by this P type region 150 so that this potential may be formed smaller (that is, formed lower) than that of the lower layer region of the photosensor 122 in a range from the maximum potential position of the vertical transfer register 124 to the overflow barrier 128.

Figure 2:
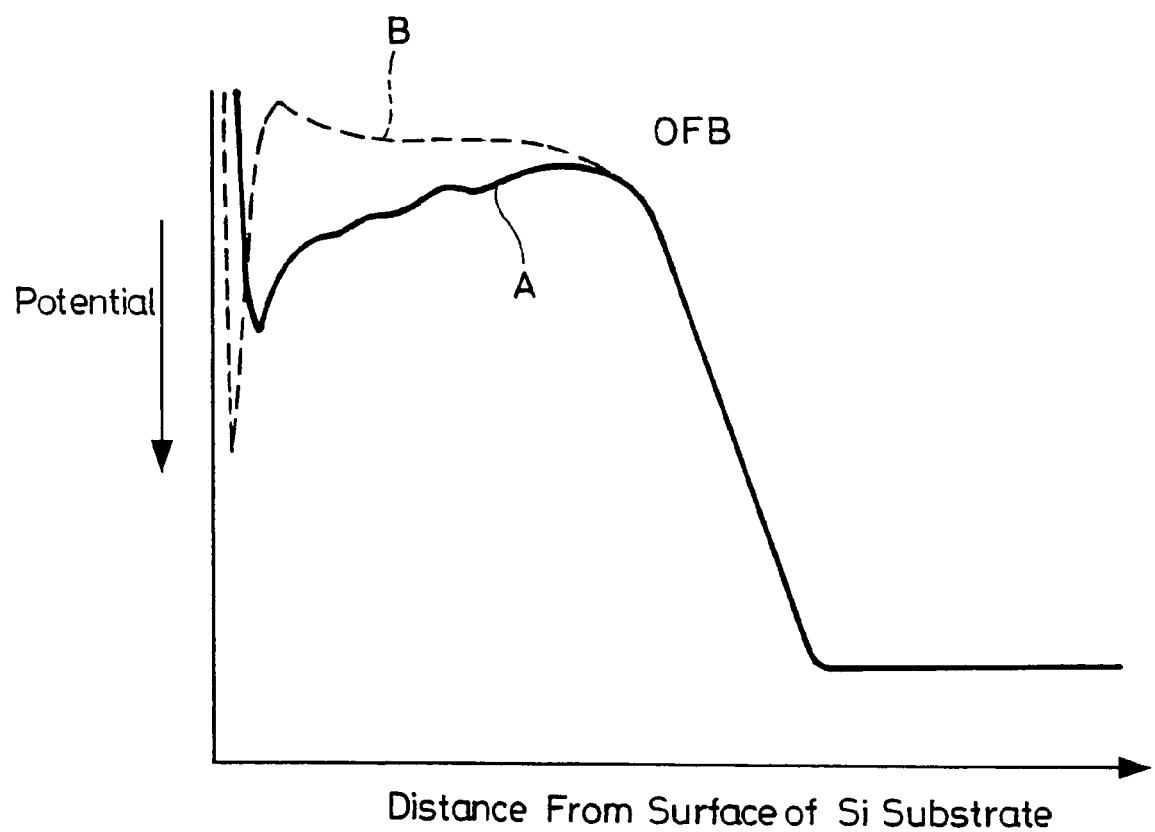
FIG. 2 is an explanatory diagram showing potential distributions of a photosensor and a vertical transfer register along the cross-section of the substrate of the CCD image sensor shown in FIG. 1.

FIG. 2 is an explanatory diagram showing potential distributions of the photosensor 122 and the vertical transfer register 124 along the cross-section of the substrate in which a vertical axis represents the depth of potential and a horizontal axis represents the depth from the surface of the substrate. Then, a solid line characteristic curve A shows a potential distribution of the photosensor portion and a broken line characteristic curve B represents a potential distribution of the vertical transfer register portion. A unit of each axis can be set arbitrarily.

Figure 3:
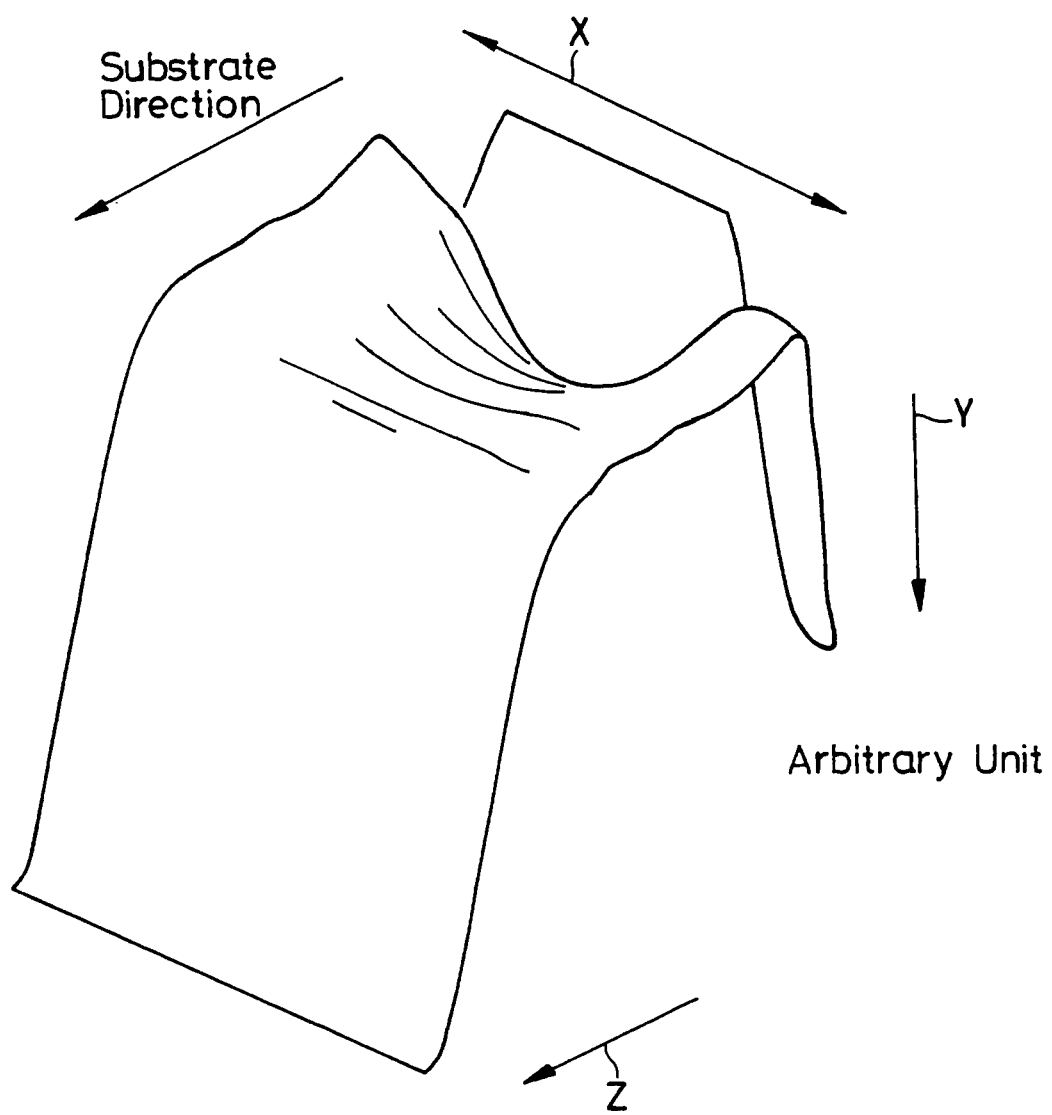
FIG. 3 is an explanatory diagram showing a potential distribution in the photosensor region of the CCD image sensor shown in FIG. 1 in a three-dimensional fashion.

Further, FIG. 3 is an explanatory diagram showing a potential distribution in the photosensor region in a three-dimensional fashion. The X axis represents the horizontal direction, the Y axis represents the potential depth direction and the Z axis represents the depth direction of the substrate, respectively. A plane formed by the X axis and the Y axis represents the surface of the substrate. A unit of each axis can be set arbitrarily. Also, "depth direction of substrate" represents the direction extending from the surface of the substrate to the rear side.

Further, in FIGS. 2 and 3, the vertical axis in FIG. 2 and the Y axis in FIG. 3 mean the fact that potential becomes higher in the lower direction.

Figure 12:
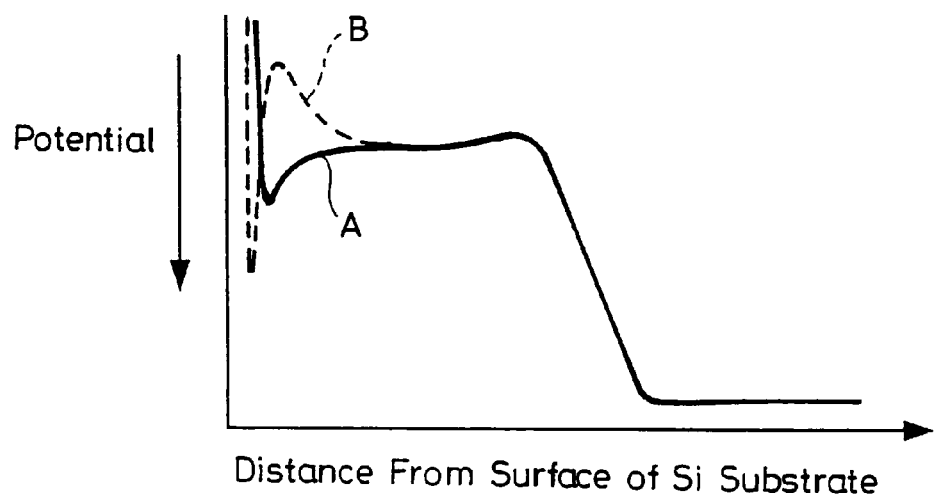
FIG. 12 is an explanatory diagram showing potential distributions of a photosensor and a vertical transfer register along the cross-section of the substrate of the CCD image sensor shown in FIG. 10.
Figure 13:
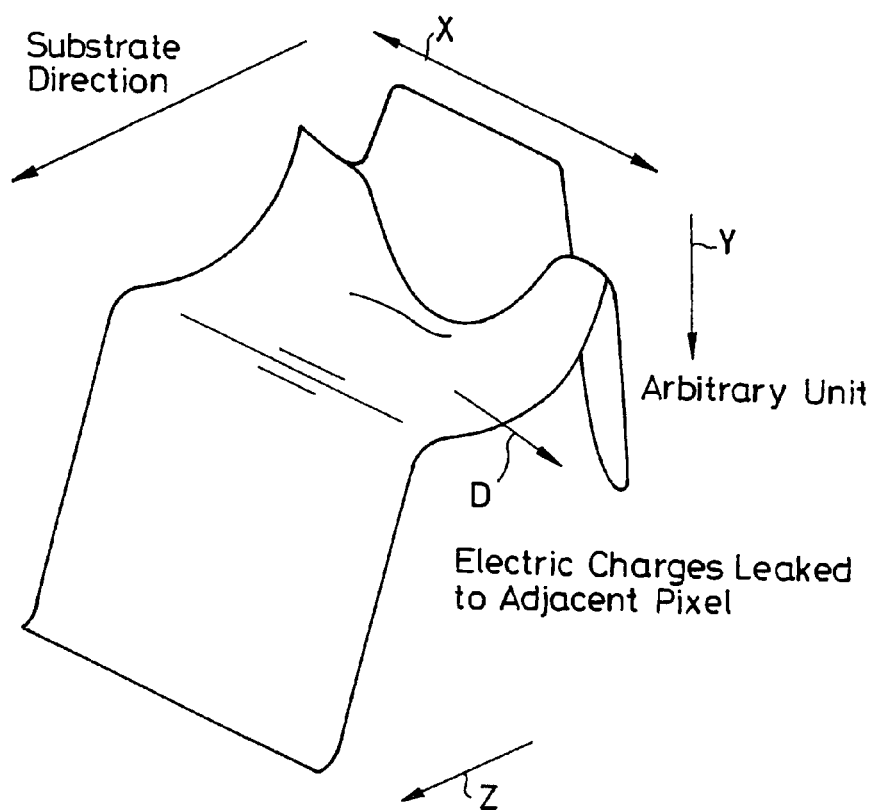
FIG. 13 is an explanatory diagram showing a potential distribution of the photosensor region of the CCD image sensor shown in FIG. 10.

In the above-mentioned potential distributions of the conventional example shown in FIGS. 12 and 13, while the position of the potential of the photosensor and the position of the potential of the lower layer portion of the vertical transfer register are equal to each other in the deep portion of the substrate, according to this embodiment, as shown in FIGS. 2 and 3, potential in the lower layer region of the vertical transfer register 124 and the channel stop region 126 is formed smaller (that is, lower) than that of the lower layer region of the photosensor 123 in a range from the minimum potential position of the vertical transfer register 124 to the overflow barrier 128.

Accordingly, in the state of this embodiment, since the potential in the lower layer region of the vertical transfer register 124 and the channel stop region 126 at both sides of the lower layer region is low, electric charges photoelectrically-converted by the sensor region are blocked by this potential barrier and cannot be diffused easily and become difficult to leak into the sensor region of the adjacent pixel. Hence, it becomes possible to effectively prevent crosstalk.

Next, an example of a manufacturing method for obtaining the potential distributions according to the first embodiment will be described in brief.

First, a high resistance substrate (high resistance layer 110B) whose resistance is higher than 100Ω is deposited on the upper layer (that is, portion ranging from the surface of the substrate to the overflow barrier) of the semiconductor substrate 110 (N type substrate 110A) by epitaxial growth.

Also, the P type region serving as the overflow barrier 128 is formed by implanting ions of P type impurities such as boron from the surface of the semiconductor substrate 110.

Also, a P type region 150 is formed at the deep position (upper layer of the overflow barrier 128) of the lower layer portion of the vertical transfer register 124 and the channel stop region 126 by implanting ions of P-type impurities.

In this manner, the partial heavily-doped P type region 150 can be formed in the high resistance layer 110B. However, this manufacturing method has been described as only an example and various methods can be applied to the above manufacturing process.

Next, a second embodiment of the present invention will be described.

According to the second embodiment of the present invention, in order to achieve more effective barrier effects, potential in the overflow barrier of the vertical transfer register (transfer portion) and potential in the overflow barrier at the intermediate portion between the adjacent pixels are made smaller than that in the overflow barrier in the photosensor portion by forming a partial lightly-doped region in the P type well region at its region corresponding to the photosensor portion (photoelectric conversion portion), whereby leakage of electric charges can be more completely prevented by the overflow barrier.

Figure 4:
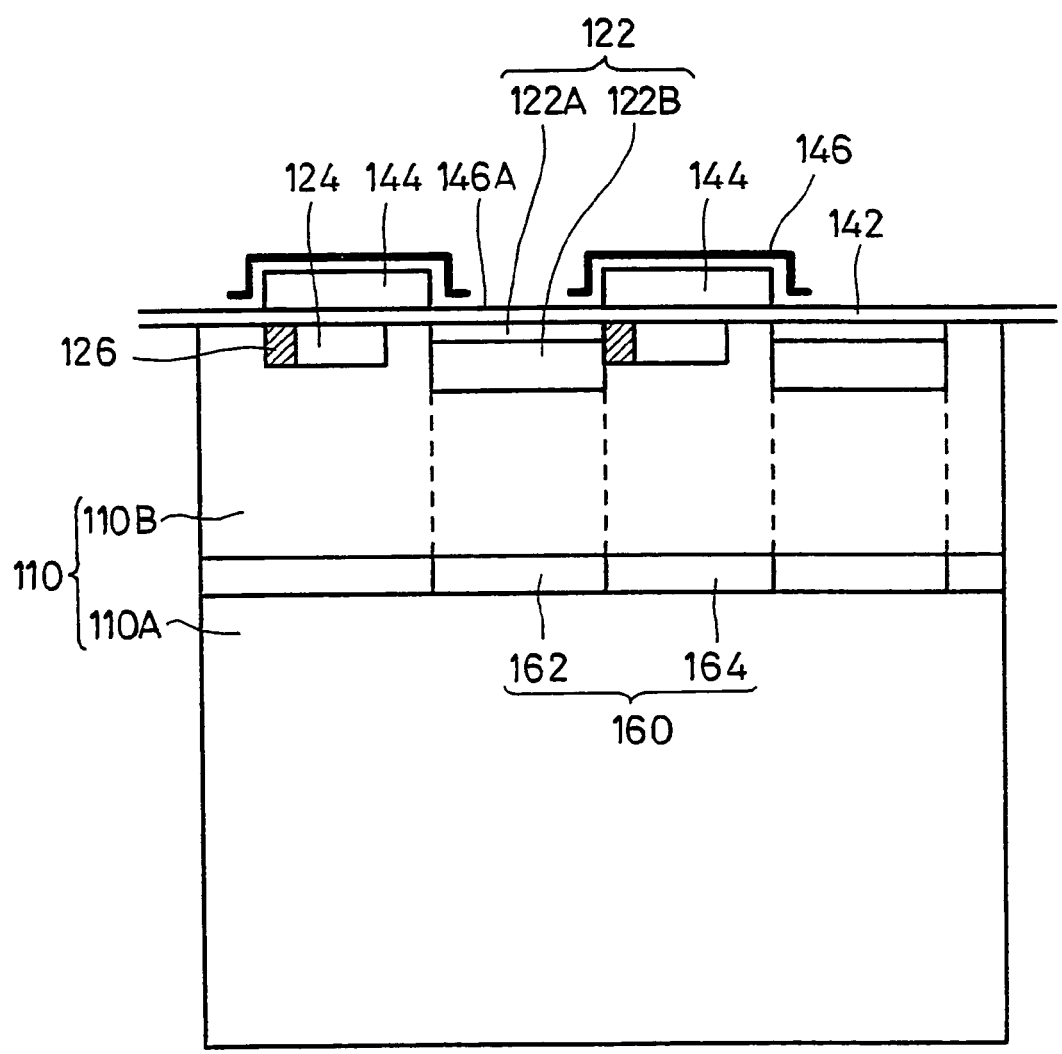
FIG. 4 is a cross-sectional view showing structures of elements of a CCD image sensor according to a second embodiment of the present invention.

FIG. 4 is a cross-sectional view showing structures of elements within a CCD image sensor according to the second embodiment of the present invention. Elements and parts common to those of FIG. 1 are denoted by identical reference numerals and therefore need not be described. Also, the manner in which the elements are arranged in the plane direction of the CCD image sensor according to this embodiment is common to that of the conventional example shown in FIG. 10. FIG. 4 shows a cross-section taken along the line a-a in FIG. 10.

While an overflow barrier 160 is formed near the boundary between the N type substrate 110A and the high resistance layer 110B comprising the semiconductor substrate (Si substrate) 110 in the image sensor according to this embodiment, the P type region forming this overflow barrier 160 has a partial lightly-doped region 162 formed at its area corresponding to the photosensor 122 and other region is formed as a region 164 with an ordinary concentration.

Consequently, potential in the overflow barrier in the vertical transfer register 124 and potential in the overflow barrier at the intermediate portion between the adjacent pixels are made smaller (that is, lower) than that in the overflow barrier of the photosensor 122.

Figure 5:
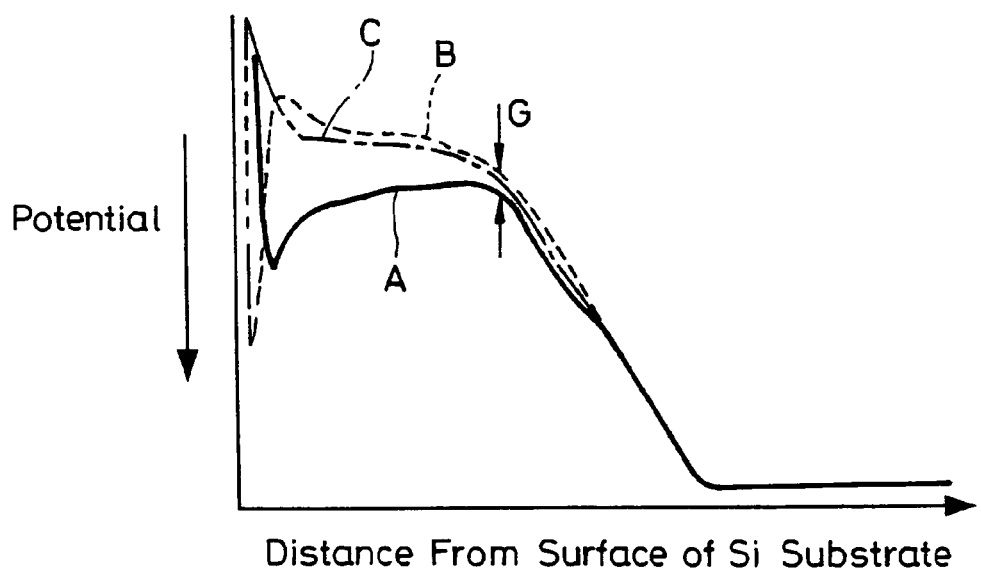
FIG. 5 is an explanatory diagram showing potential distributions of a photosensor and a vertical transfer register along the cross-section of the substrate of the CCD image sensor shown in FIG. 4.

FIG. 5 is an explanatory diagram showing potential distributions of the photosensor 122, the vertical transfer register 124 and the intermediate portion of the adjacent pixels along the cross-section of the substrate in which the vertical axis represents the depth of potential and the horizontal axis represents the depth from the surface of the substrate. Then, a solid line characteristic curve A represents a potential distribution of the photosensor portion, a broken line characteristic curve B represents a potential distribution of the vertical transfer register portion and a dot-and-dash line characteristic curve C represents a potential distribution of the intermediate portion between the adjacent pixels. The units of the respective axes can be set arbitrarily.

Figure 6:
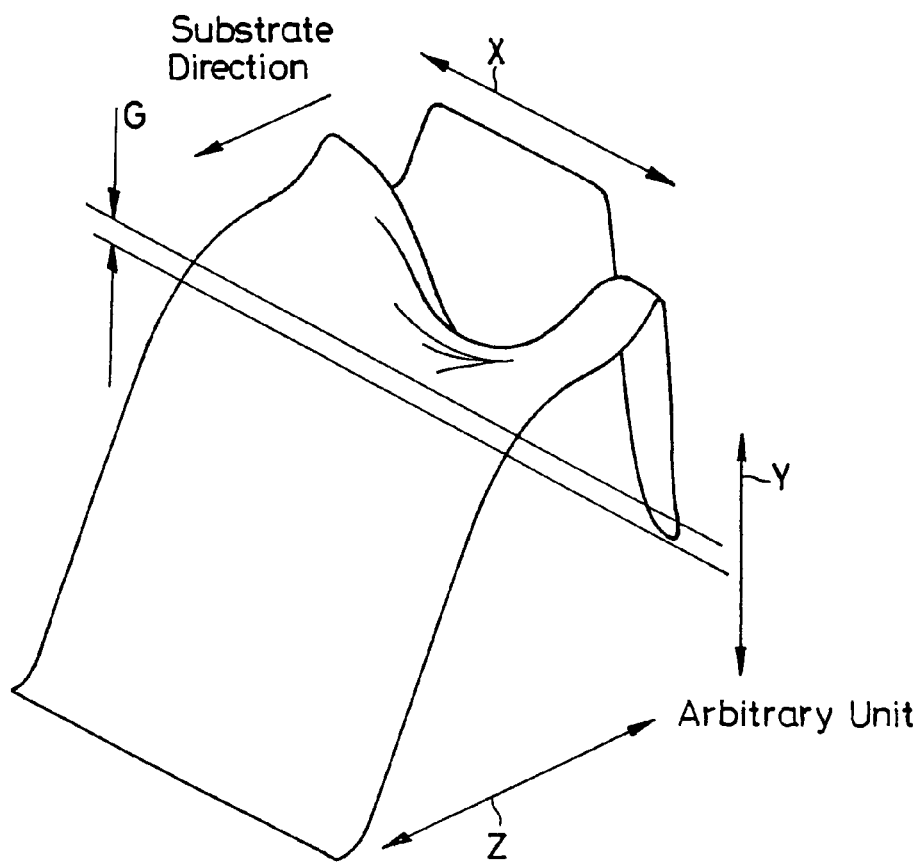
FIG. 6 is an explanatory diagram showing a potential distribution in the photosensor region of the CCD image sensor shown in FIG. 4 in a three-dimensional fashion.

Further, FIG. 6 shows the potential distribution in the photosensor region in a three-dimensional fashion in which the X axis represents the horizontal direction, the Y axis represents the potential depth direction, the Z axis represents the depth direction of the substrate, respectively. The plane formed by the X axis and the Y axis represents the surface of the substrate. The units of the respective axes can be set arbitrarily.

Also, in FIGS. 5 and 6, the vertical axis of FIG. 5 and the Y axis of FIG. 6 mean that the potential becomes higher in the lower direction.

In the above-mentioned potential distributions according to the first embodiment shown in FIGS. 2 and 3, the potential of the photosensor portion and the potential of the vertical transfer register are coincident with each other at the depth position of the overflow barrier. According to this embodiment, as shown in FIGS. 5 and 6, the potential in the overflow barrier 160 of the vertical transfer register 124 and the potential in the overflow barrier 160 at the intermediate portion between the adjacent pixels are made smaller (shown by a potential difference G in FIGS. 5 and 6) than that in the overflow barrier 160 of the photosensor 122, whereby leakage of electric charges in the overflow barrier 160 can be more completely prevented. Hence, effect for suppressing crosstalk and effect for increasing sensitivity can be achieved.

If impurity concentrations of the overflow barrier 160 are made different, then potential in the lower layer region of the vertical transfer register 124 and the channel stop region 126 can be adjusted by the impurity concentration of the overflow barrier 160 without forming the partial P type region 150 that has been described so far in the first embodiment and the above potential can be formed smaller (that is, lower) than the potential of the lower layer region of the photosensor 122 in a range from the maximum potential position of the vertical transfer register 124 to the overflow barrier 128. Conversely, the second embodiment can be effected together with the first embodiment. A rest of the arrangement is common to that of the above-mentioned first embodiment and therefore need not be described.

Next, two examples of a manufacturing method for obtaining the potential distributions according to the second embodiment will be described.

In order to obtain the concentration distribution of the above-mentioned overflow barrier 160, there can be used a method (first method) composed of a combination of a method of implanting ions of P type impurities with an ordinary concentration into the whole of the overflow barrier and a method of implanting ions of N type impurities into the corresponding area of the photosensor 122 and a method (second method) composed of a combination of a method of implanting ions of P type impurities with a low concentration into the whole of the overflow barrier and a method of implanting ions of P type impurities with a low concentration into the corresponding area of the photosensor 122.

First, the first method will be described first with reference to FIG. 4.

According to this method, ions of P type impurities with a similar concentration to that of the prior art are implanted into the whole area forming the overflow barrier 160. Next, ions of N type impurities are implanted into the corresponding area of the photosensor 122, whereby the P type impurity concentration at this portion is lowered to form the low concentration region 162. Other area serves as the ordinary concentration region 164.

Next, the second method will be described with reference to FIG. 7.

Figure 7A:
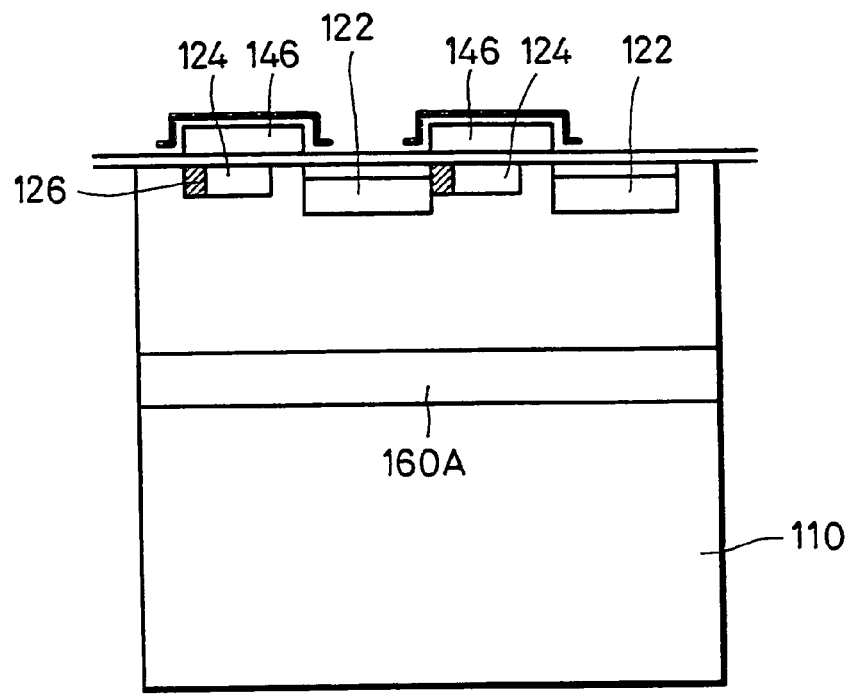
FIG. 7 is a cross-sectional view showing a method of forming an overflow barrier of the CCD image sensor shown in FIG. 4.
Figure 7A:
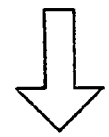

First, in FIG. 7A, the impurity region 160A is formed by implanting ions of P type impurities with a low concentration into the whole area forming the overflow barrier 160.

Figure 7B:
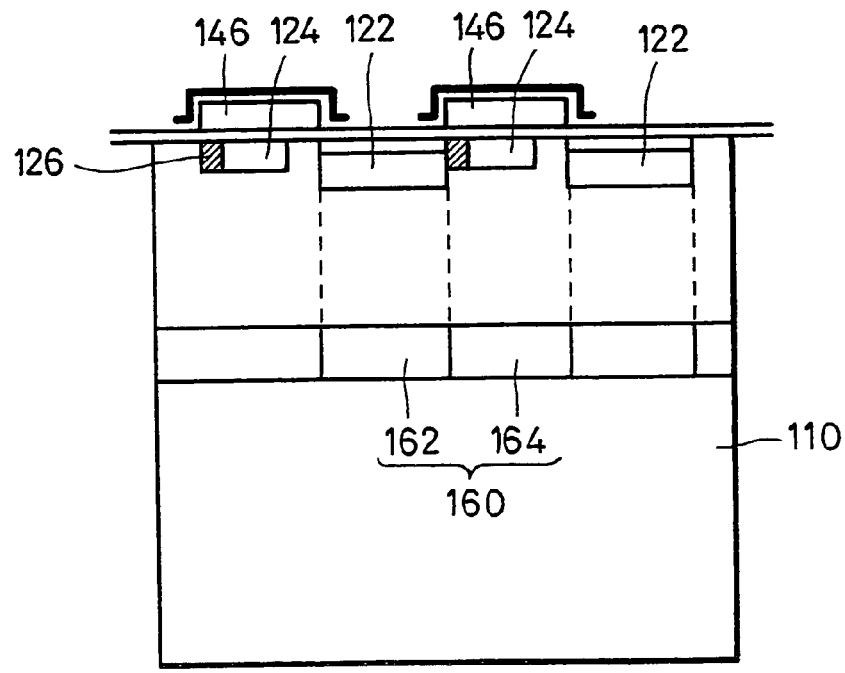

Next, in FIG. 7B, at the second time, ions of P type impurity with a low concentration are implanted into the corresponding areas of the vertical transfer register 124 and the intermediate portion between the adjacent pixels except the corresponding area of the photosensor 122, whereby the P type impurity concentration at this portion is changed to the ordinary concentration and the corresponding area is formed as the ordinary concentration region 164.

Also, the corresponding area of the photosensor 122 into which ions of impurities were not implanted at the second time is left as a low concentration region and this region is formed as the low concentration region 162.

It should be noted that a ratio of the dose of the first ion implantation and the dose of the second ion implantation is determined on the basis of the depth of the potential of the overflow barrier of the photosensor portion.

According to the second method, since ions of the same P type impurities are implanted, it is possible to implant ions of impurities without considering a range difference (boron>phosphorus>arsenic) made by impurities. There is then an advantage that the overflow barrier can easily be formed at the deeper position.

Next, a third embodiment of the present invention will be described.

In the third embodiment of the present invention, effective barrier effect for suppressing crosstalk may be demonstrated and potential of the photosensor portion (photoelectric conversion portion) may be increased, whereby a difference between the potential of the photosensor portion and the potential of the vertical transfer register can be increased to make the barrier effect become more effective.

Figure 8:
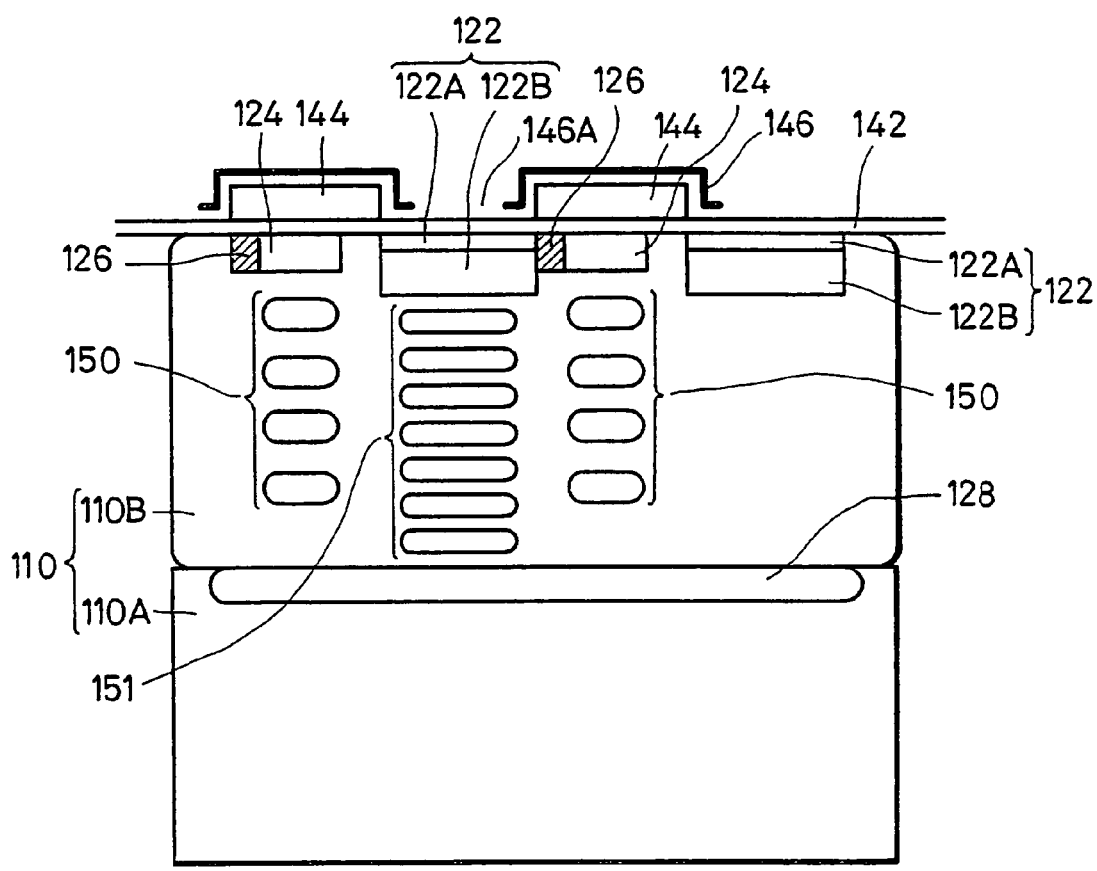
FIG. 8 is a cross-sectional view showing structures of elements of a CCD image sensor according to a third embodiment of the present invention.

FIG. 8 is a cross-sectional view showing structures of elements within a CCD image sensor according to a third embodiment of the present invention. Elements and parts common to those of FIG. 1 are denoted by identical reference numerals and therefore need not be described. Also, the manner in which the elements are arranged on the plane direction of the CCD image sensor according to this embodiment is common to that of the conventional example shown in FIG. 10. FIG. 8 shows the cross-section taken along the line a-a in FIG. 10.

In this embodiment, as shown in FIG. 8, partial P type regions 150 are respectively and independently arranged in four layers at predetermined positions of the lower layer region of the vertical transfer register 124 and the channel stop region 126. Potential in the lower layer region of the vertical transfer register 124 and the channel stop region 126 is adjusted by the P type region 150, whereby the above potential can be made smaller (lower) than that of the lower layer region of the photosensor 122 in a range from the maximum potential position of the vertical transfer register 124 to the overflow barrier 128.

Also, in this embodiment, partial N type regions 151 are respectively and independently arranged in seven layers at predetermined positions of the lower layer region of the photosensor 122. Potential in the lower layer region of the photosensor 122 is adjusted by the N type region 151, whereby potential of the lower layer region of the photosensor 122 can be made much larger (higher) than that of the first embodiment. The N type regions 151 are formed at the positions with depths different from those of the P type regions 150.

Figure 9:
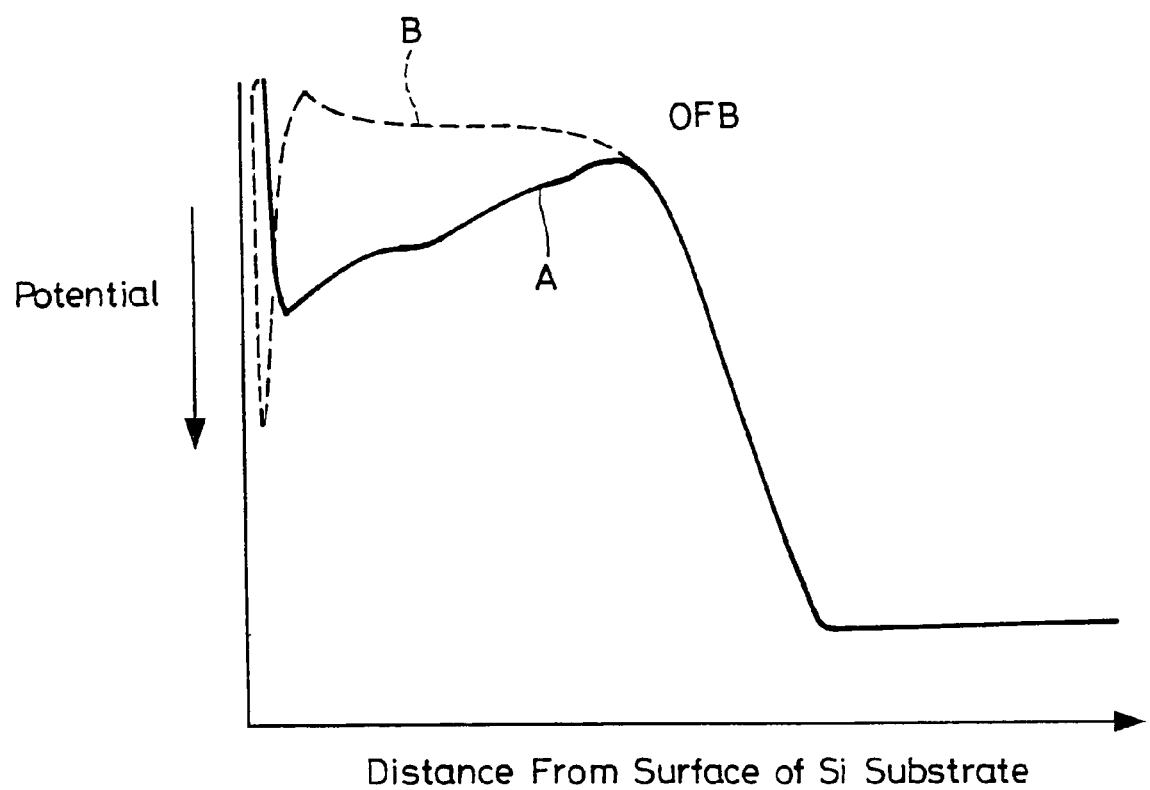
FIG. 9 is an explanatory diagram showing potential distributions of a photosensor, a vertical transfer register and a portion between the adjacent pixels along the cross-section of the substrate of the CCD image sensor shown in FIG. 8.

FIG. 9 is an explanatory diagram showing potential distributions of the photosensor 122, the vertical transfer register 124 and the intermediate portion between the adjacent pixels along the cross-section of the substrate in which the vertical axis represents the depth of potential and the horizontal axis represents the depth from the surface of the substrate. Then, a solid line characteristic curve A represents the potential distribution of the photosensor portion and the broken line characteristic curve B represents the potential distribution of the vertical transfer register portion. The units of the respective axes can be set arbitrarily.

According to this embodiment, as shown in FIG. 9, potential in the lower layer region of the vertical transfer register 124 and the channel stop region 126 is made smaller (that is, lower) than that of the lower layer region of the photosensor 122 in a range from the minimum potential position of the vertical transfer register 124 to the overflow barrier 128 Also, according to this embodiment, potential in the lower layer region of the photosensor 122 is formed much larger than that of the case of the first embodiment shown in FIG. 2.

Accordingly, in this state, since potential in the lower layer region of the vertical transfer register 124 and the channel stop region 126t at both sides is low, electric charges photo-electrically-converted by the sensor region are blocked by this potential barrier, they cannot be diffused easily and they become difficult to leak into the sensor region of the adjacent pixel, thereby making it possible to effectively prevent crosstalk. In particular, according to this embodiment, since the potential in the lower layer region of the photosensor 22 is large, a level difference between it and the potential barrier increases and the barrier effect becomes stronger and hence crosstalk can be prevented more effectively.

While the P type region 150 is arranged in four layers and the N type region 151 is arranged in seven layers according to the third embodiment, the P type region 150 is not limited to four layers and a P type region can be arranged in single layer or a plurality of layers with similar effects being achieved. Similarly, the N type region 151 is not limited to the seven layers and an N type region can be arranged in a single layer or a plurality of layers with similar effects being achieved.

While the present invention has been applied to the CCD image sensor in which the photosensors are arrayed in a matrix fashion, the present invention is not limited thereto and can be similarly applied to other solid-state image pickup devices using a CCD.

Also, while the present invention has been applied to the case in which electrons generated from the photoelectric conversion portion can be handled, the present invention can similarly be applied to an arrangement in which holes are handled. In that case, polarities of P and S of respective semiconductor regions and polarities of potential may be reversed. That is, magnitude (high and low) of potential in the present invention means that an absolute value is assumed to be a standard value.

As described above, according to the solid-state image pickup device and the manufacturing method thereof of the present invention, since the potential in the lower layer region of the transfer portion becomes smaller than that of the lower layer region of the photoelectric conversion portion in the range from the minimum potential position to the overflow barrier, even when the overflow barrier is formed at the deep position of the substrate, signal electric charges accumulated in the lower layer region of the photoelectric conversion portion can be prevented from leaking into the side of the adjacent transfer portion.

Further, according to the solid-state image pickup device and the manufacturing method thereof of the present invention, since the potential in the overflow barrier of the transfer portion and the potential in the overflow barrier in the intermediate portion between the adjacent pixels become smaller than that in the overflow barrier of the photoelectric conversion portion, even when the overflow barrier is formed at the deep position of the substrate, signal electric charges accumulated in the lower layer region of the photoelectric conversion portion can be prevented from leaking into the adjacent transfer portion and the pixel side.

As a result, while the occurrence of crosstalk caused when the overflow barrier is formed at the deep position of the semiconductor substrate is being removed and image quality is being prevented from being deteriorated, an amount of electric charges accumulated in each pixel can be increased and improvement of sensitivity can be realized.

DESCRIPTION OF REFERENCE NUMERALS

110 . . . semiconductor substrate
110A . . . N type substrate
110B . . . P type layer
122 . . . photosensor
122A . . . $P^+$ layer
122B . . . N layer
124 . . . vertical transfer register
126 . . . channel stop region
128 . . . overflow barrier
142 . . . insulating film
144 . . . transfer electrode
146 . . . light-shielding film
150 . . . P type region

The invention claimed is:

1. A solid-state image pickup device comprising:
a photosensor portion having first and second opposite sides, the photosensor portion being provided on the surface of a substrate to convert light incident on said first side into electric charges;
a transfer portion formed on the surface of said substrate to transfer said electric charges read out from said photosensor portion; and
an overflow barrier formed within said substrate and opposite the second side of said photosensor portion to discharge unnecessary electric charges of said electric charges,
wherein potential under said transfer portion is formed smaller than that formed under said photosensor portion along the depth direction of said substrate in a range from the minimum potential position to said overflow barrier,
wherein said transfer portion has one or a plurality of impurity regions formed at its second side,
wherein one or a plurality of second impurity regions formed under said photosensor portion are formed with depths different from that of said impurity region, and
wherein said impurity region is arranged in four layers along the depth direction of said substrate and said second impurity region is arranged in seven layers along the depth direction of said substrate.

2. A solid-state image pickup device according to claim 1, wherein said impurity region is a P type impurity region and said second impurity region is an N type impurity region.

3. A solid-state image pickup device according to claim 1, wherein said substrate is composed of a first substrate and a second substrate formed on an upper layer of said first substrate and which is higher in resistance than said first substrate, said first substrate being of a first conductivity type and said second substrate being of said first conductivity type or a second conductivity type.

4. A solid-state image pickup device comprising:
a photosensor portion having first and second opposite sides, the photosensor portion being provided on the surface of a substrate to convert light incident on said first side into electric charges;
a transfer portion formed on the surface of said substrate to transfer said electric charges read out from said photosensor portion; and
an overflow barrier formed within said substrate and opposite the second side of said photosensor portion to discharge unnecessary electric charges of said electric charges, wherein potential under said transfer portion is formed smaller than that formed under said photosensor portion along the depth direction of said substrate in a range from the minimum potential position to said overflow barrier, wherein said transfer portion has one or a plurality of impurity regions formed at its second side, wherein one or a plurality of second impurity regions formed under said photosensor portion are formed with depths different from that of said impurity region, and wherein said impurity region is arranged in more than three layers along the depth direction of said substrate and said second impurity region is arranged in more than three layers along the depth direction of said substrate.

5. A solid-state image pickup device according to claim 4, wherein said impurity region is a P type impurity region and said second impurity region is an N type impurity region.

6. A solid-state image pickup device according to claim 4, wherein said substrate is composed of a first substrate and a second substrate formed on an upper layer of said first substrate and which is higher in resistance than said first substrate, said first substrate being of a first conductivity type and said second substrate being of said first conductivity type or a second conductivity type.

* * * * *